United States Patent [19]

Rebjock

[11] Patent Number: 4,996,411

[45] Date of Patent: Feb. 26, 1991

[54] METHOD OF MANUFACTURING A CARD HAVING ELECTRONIC MEMORY AND A CARD OBTAINED BY PERFORMING SAID METHOD

[75] Inventor: Alain Rebjock, Cergy, France

[73] Assignee: Schlumberger Industries, Montrouge, France

[21] Appl. No.: 75,485

[22] Filed: Jul. 20, 1987

[30] Foreign Application Priority Data

Jul. 24, 1986 [FR] France ................................ 86 10753

[51] Int. Cl.⁵ ............................................. G06K 19/02
[52] U.S. Cl. .................................... 235/488; 235/492; 357/80; 29/414; 29/831
[58] Field of Search ...................... 235/488, 492, 380; 357/80; 29/414, 592.1, 831, 832

[56] References Cited

U.S. PATENT DOCUMENTS

| 4,578,573 | 3/1986 | Flies et al. ........................ 235/492 |
| 4,674,175 | 6/1987 | Stampfli ........................ 235/492 X |
| 4,737,620 | 4/1988 | Mollet et al. ................... 235/488 X |

FOREIGN PATENT DOCUMENTS 61-15289  1/1986  Japan.
2047474  11/1980  United Kingdom.

*Primary Examiner*—David Trafton
*Attorney, Agent, or Firm*—Frishauf, Holtz, Goodman & Woodward

[57] ABSTRACT

The invention relates to implanting an electronic module (i.e. an integrated circuit plus electrical contact tabs) in the body of an electronic memory card. The integrated circuit (38) is directly fixed to a lead frame (10) defining electrical connections and electrical contact tabs. The terminals (42) of the integrated circuit (38) are connected by wires (44) to the lead frame. The assembly is placed in a cavity provided in the card body. Such cards constitute credit cards, for example.

12 Claims, 7 Drawing Sheets

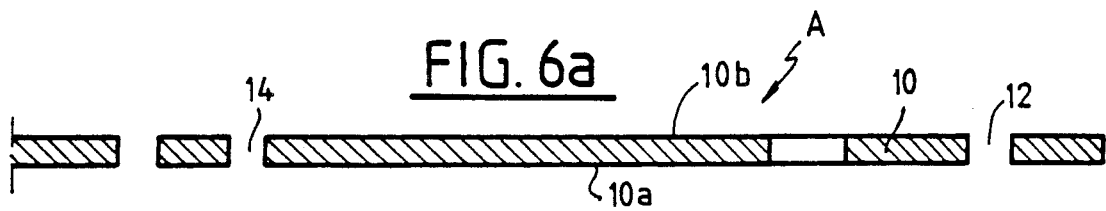
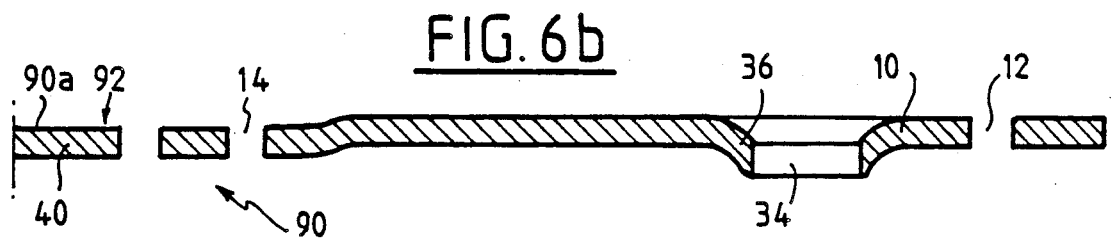
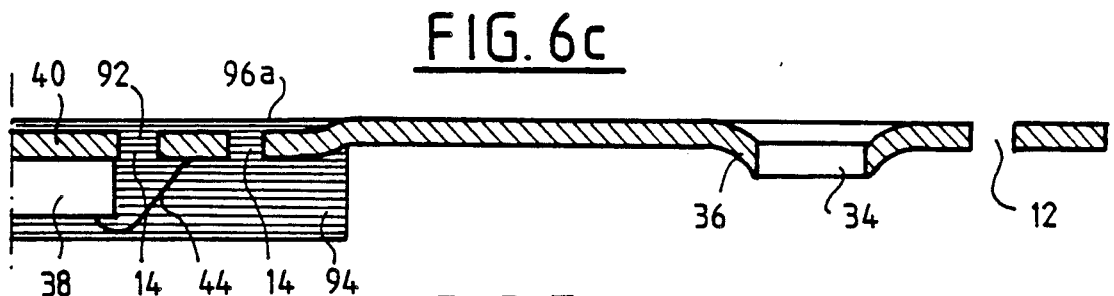
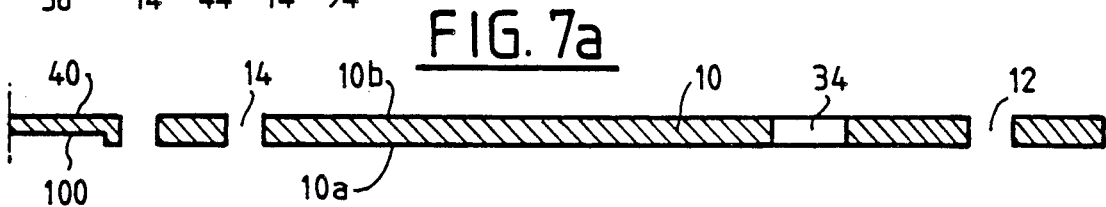
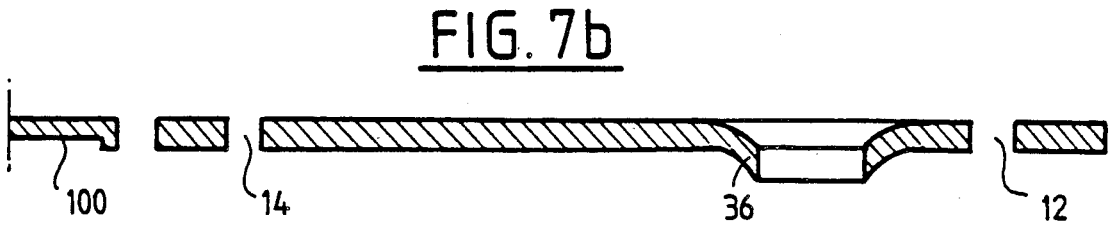
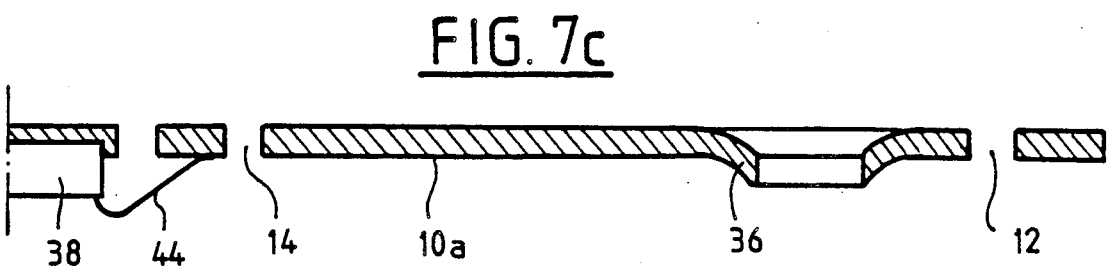

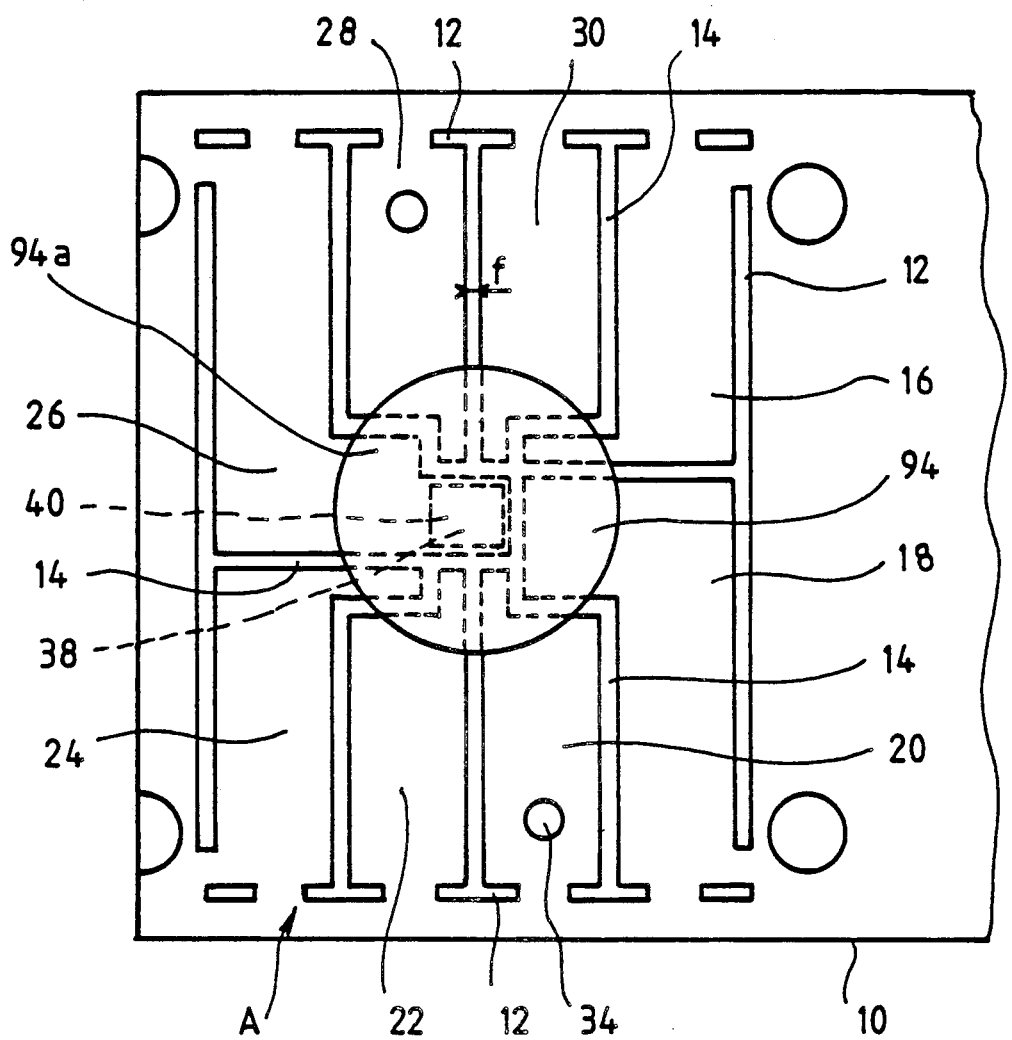

METHOD OF MANUFACTURING A CARD HAVING ELECTRONIC MEMORY AND A CARD OBTAINED BY PERFORMING SAID METHOD

The present invention relates to a method of manufacturing a card having electronic memory and to cards having electronic memory as obtained by implementing the method.

BACKGROUND OF THE INVENTION

Cards having electronic memory and enabling their holders to perform various transactions are now well known. There are two broad categories of such cards. Some cards have electronic circuits which are sufficiently complex to enable credit data to be reloaded into the card memory. In other words when the initial credit in the card has been spent, the user can have the card 37 reloaded" with a new amount of credit in return for suitable payment. A second or "pre-paid" type of card contains a simpler electronic circuit and the card is loaded once only with a given amount of credit. Once this credit has been spent by the user, the card must be thrown away.

It will be understood that pre-paid cards which can be used once only must be capable of being manufactured as cheaply as possible so that the manufacturing cost of the card is not excessive relative to the necessarily small amount of credit which it is capable of storing. Low cost is achieved in part by the fact that the electronic circuit itself is considerably less expensive than the electronic circuit of a reloadable card. However, the cost of manufacturing the card itself is a non-negligible quantity in the final cost of the card. Such a card is essentially constituted by a body made of plastic material, and an electronic module lodged therein, said module comprising the integrated circuit, contact tabs for providing connection with a card reader, and electrical connections between the integrated circuit and the contact tabs. The electronic module must be fixed in the body of the card in a manner which is capable of ensuring that the resulting assembly can pass the bending tests to which such cards are subjected. In addition, the thickness of the card is standardized, and the standard thickness is about one millimeter. It will be understood that this small thickness increases the difficulty of installing and fixing an electronic module in the card.

In general, the electronic module is made using a printed circuit technique. More precisely, the electronic module comprises an insulating substrate on which conductive tracks are formed to provide a portion of the electrical connections between contact tabs likewise formed on the insulating substrate and the terminals of the semiconductor chip itself. The semiconductor chip is fixed on one of the faces of the insulating substrate and its terminals are connected to the conductive tracks by means of conductive wires, for example. This technique suffers from the drawback that manufacturing printed circuits is relatively expensive if the printed circuit is to be very small with a high density of conductive tracks.

In order to remedy this drawback, one aim of the invention is to provide a method of making electronic memory cards which does not make use of printed circuit techniques for making the electronic module.

SUMMARY OF THE INVENTION

In order to achieve this aim, the invention makes the electronic module by means of the lead frame technique instead of the printed circuit technique.

The present invention provides a method of making an electronic memory card comprising the following stages:

an electronic module is provided comprising a plane set of electrical conductors having a first face and a second face, with a semiconductor chip being fixed directly to the first face of the plane set of conductors;

a card body is provided having a first face and a second face with a housing being provided in the card body, opening out into said first face thereof, and suitable for receiving said electronic module;

the electronic module is placed in the housing so that the second face of the plane set of conductors lies substantially at the same level as the first face of the card body; and the electronic module is fixed to the card body.

In a preferred implementation, the method of manufacturing an electronic memory card comprises the following stages:

an electronic module is provided comprising a plane set of electrical conductors having a first face and a second face, said faces being provided with at least one fixing hole, and a semiconductor chip being fixed on the first face of the plane set of conductors;

a card body is provided in a first face and a second face, the card body having a first hollow opening out into its first face to receive the plane set of conductors, a second hollow opening out into the bottom of the first hollow to receive the semiconductor chip, and fixing studs projecting from the first hollow in spaced relationship with the fixing holes;

the plane set of conductors is placed in the first hollow so that the studs penetrate into the fixing holes and so that the semiconductor chip penetrates into the second hollow;

the heads of the studs are crushed in order to position the electronic module on the body of the card and provide preliminary fixing therefor; and glue is inserted into the second hollow and is caused to set in order to provide final fixing of the electronic module.

It will be understood that in this implementation of the method of the invention, the plane set of electrical conductors forms a lead frame. It will also be understood that the crushing of the heads of the studs serves initially solely to position the electronic module relative to the body of the card and to provide temporary fixing. Final fixing is obtained by substantially filling the hollow with glue, thereby not only providing final bonding, but also providing mechanical reinforcement of the electronic module in the body of the card.

The second hollow preferably includes a central cavity for receiving the semiconductor chip together with a plurality of subsidiary cavities which communicate with the central cavity and which open out into the first cavity, with the subsidiary cavities being shallower in the card body thickness direction than the central cavity.

It will thus be understood that when the glue is inserted it also penetrates by capillarity into the subsidiary cavities between the body of the card and the plane set of conductors, thereby not only fixing the electronic module, but also mechanically reinforcing the lead frame.

Also preferably, the plane set of conductors is constituted by a metal plate having slots for separating the metal conductors form one another, with the different conductors being mechanically connected to one another by bridges. After the electronic module has been fixed to the body of the card, these bridges are cut to as to obtain the desired conductor configuration.

Also preferably, the zones of the metal conductors which surround the fixing holes are stamped so as to form flared zones which project into the first face of the plane set of conductors, and the studs are surrounded by respective grooves into which the flared zones of the plane set of conductors penetrate. The crushed ends of the studs are substantially entirely received in the flared zones.

The invention also provides an electronic module for an electronic memory card, said module comprising:

a substantially plane set of electrical conductors for forming the contact tabs of the electronic module and for forming connection zones;

a semiconductor chip directly fixed to one of the faces of said set of electrical conductors; and electrical connection means between the terminals of said semiconductor chip and said electrical conductors.

The invention also provides an electronic memory card comprising:

an electronic module as defined above;

a card body provided with a housing opening out into at least one of the two faces of the card body in order to receive said electronic module in such a manner that the portions of said electrical conductors which form the contact tabs are substantially in the same plane as said face of the card body; and means for bonding said electronic module to said card body.

BRIEF DESCRIPTION OF THE DRAWINGS

Implementations of the invention are described by way of example with reference to the accompanying drawings, in which:

FIGS. 4a to 4d are half views in vertical section illustrating the different stages in fixing the electronic module to the body of the card, in accordance with the first implementation of the invention;

FIGS. 6a to 6c are half views in vertical section showing the stages in which an electronic module is made in accordance with a second implementation of the invention;

FIG. 6d is a plan view corresponding to FIG. 6c;

FIGS. 7a to 7c are half views in vertical section showing stages in making an electronic module in accordance with a third implementation of the invention.

DETAILED DESCRIPTION OF THE PREFERRED IMPLEMENTATIONS

Figure 1:
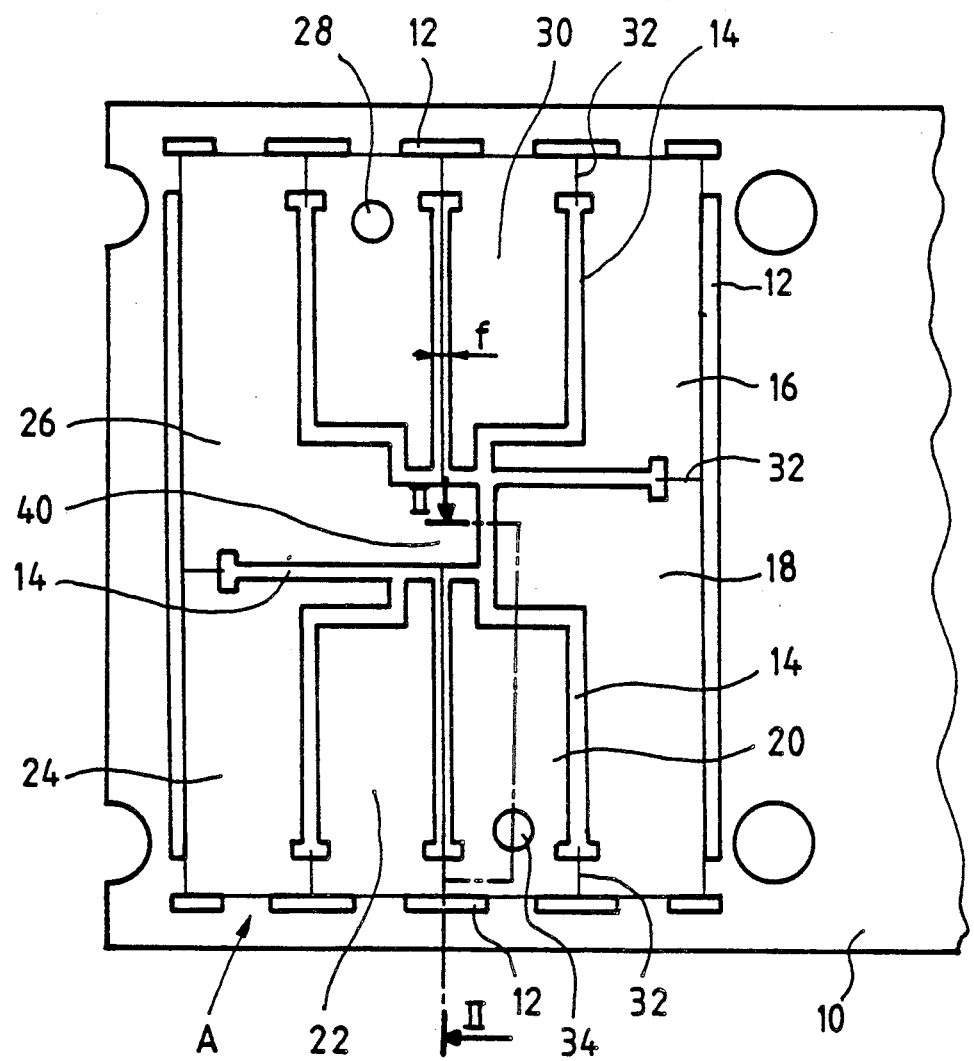
FIG. 1 is a plan view of a lead frame in accordance with a first implementation of the invention.
Figure 2:
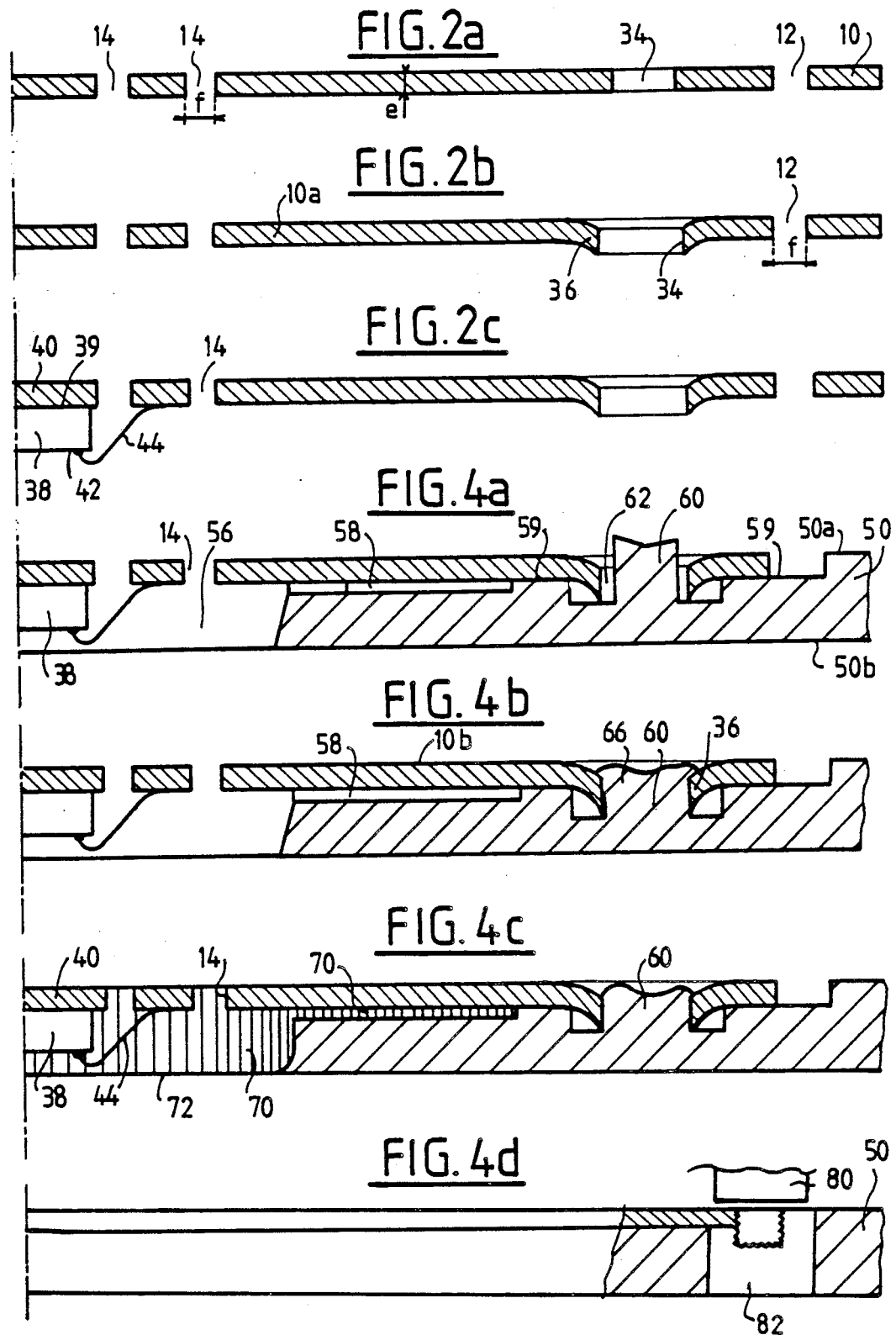
FIGS. 2a to 2c are half-views in vertical section showing the stages in which the electronic module including the lead frame shown in FIG. 1 is manufactured.

Reference is made initially to FIGS. 1, 2a, 2b, and 2c to describe a first implementation of an electronic module. More precisely, FIGS. 1 and 2a show a first stage in making the lead frame of the electronic module. Preferably, the lead frame is made in a strip metal conductor material 10. A plurality of lead frames can be made from a single strip. A single frame referenced A is shown in FIG. 1. The portion of the strip 10 corresponding to the useful portion of a lead frame is delimited by pre-cutout slots such as 12. In the particular case in FIG. 1, the pre-cutout slots 12 define a rectangular area. Within this area, the metal strip 10 has slots such as 14 passing therethrough, thereby separating various conductive zones intended to provide the various electrical connections and contact tabs which are to be made. In FIG. 1, the slots 14 define eight connection zones and contact tabs referenced 16 to 30. In order to ensure that this assembly holds together mechanically, the slots 14 do not extend as far as the pre-cutout slots 12, so that interconnection bridges such as 32 are left in position. The lead frame A also includes fixing holes 34 disposed in the vicinity of the ends of the conductive zones. FIG. 1 shows only those holes 34 which are provided through the conductive zones 20 and 28, in order to avoid overcrowding the figure. There are preferably ten such holes.

In the example shown, the metal strip 10 has a thickness e equal to 2/10 of a millimeter, thereby providing adequate mechanical strength. It is made, for example, from a copper-iron alloy whose coefficient of thermal expansion is very close to that of silicon. The slots such as 14 have a width f which is as small as possible for reasons which are explained below. A width f equal to 3/10 of a millimeter provides sufficient electrical isolation between two adjacent conductive zones. The fixing holes 34 have a diameter of 6/10 of a millimeter. The slots 12 and the fixing holes 34 are preferably obtained by chemically etching a solid metal strip.

As shown in FIG. 2b, the next stage is to stamp the zone of the conductor strip 10 surrounding each fixing hole 34. As a result, flared zones 36 are obtained which project beyond the bottom face 10a of the metal strip 10. After such stamping, the diameters of the fixing holes 34 are increased to about 0.8 mm.

In the next stage, shown in FIG. 2c, a semiconductor chip 38 is fixed on the bottom face 10a of the metal strip. More precisely, the semiconductor chip 38 is fixed to the end 40 of the conductive zone 26. The semiconductor chip 38 is fixed by its base 39 to the conductive zone 40 by means of an electrically conductive glue. This electrical connection can also be provided by forming a eutectic. Such a eutectic bond can be used because the substance from which the strip 10 is made is capable of withstanding without damage the temperature which must be used to make the eutectic. Such a solution is impracticable when the electronic module is made from a printed circuit. Finally, the terminals such as 42 of the semiconductor chip 38 are connected to the appropriate conductive zones 16 to 13 by means of conductor wires 44. A complete electronic module is thus obtained which is provisionally still part of the strip 10.

Figure 3:
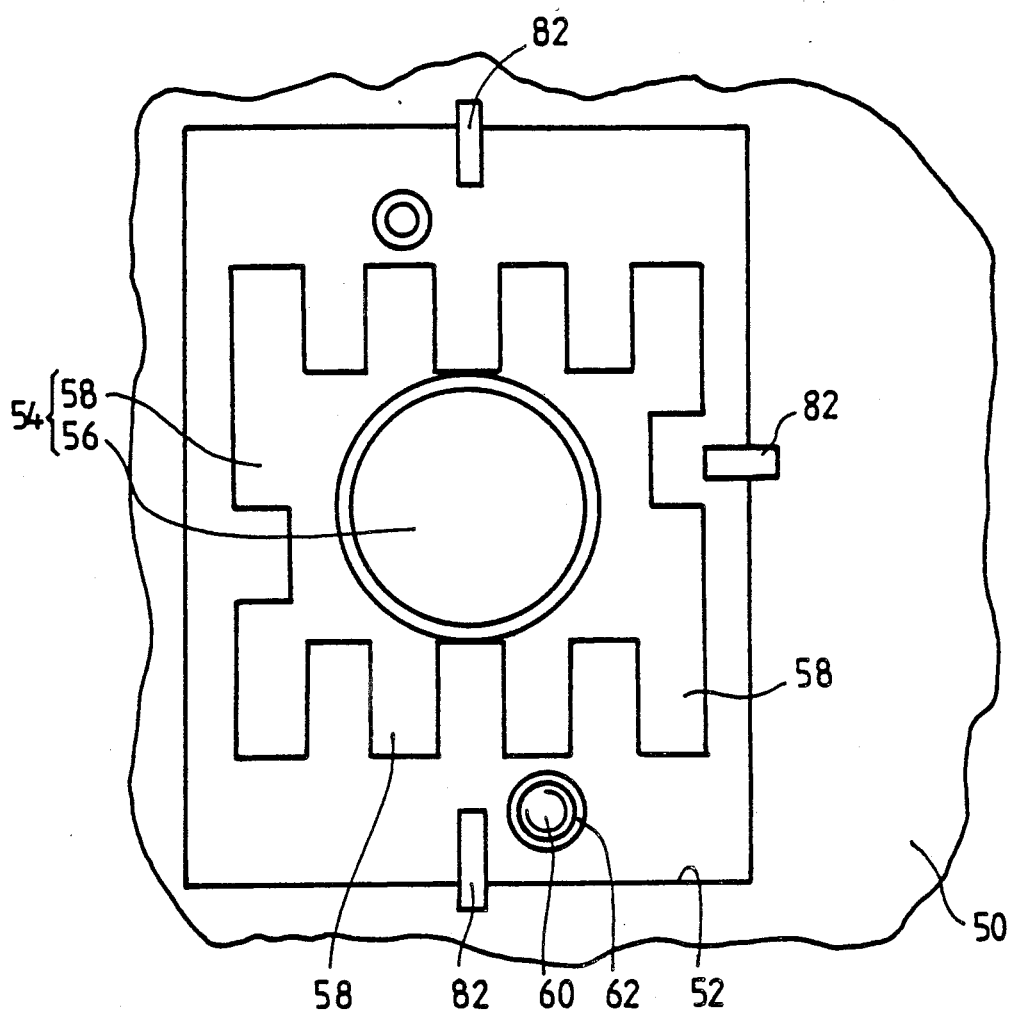
FIG. 3 is a fragmentary view of the top of the card body showing the shape of the hollows formed therein in accordance with a first implementation of the invention.

The special shape given to the portion of the card body in which the electronic module is implanted is now described with reference to FIGS. 3 and 4a.

The body of the card referenced 50 is 0.83 mm thick between its bottom face 50b and its top face 50a for receiving the connection tabs. The body of the card has a first hollow 52 which opens out into the top face 50a of the card body. The hollow 52 is 0.2 mm deep, or more generally its depth is equal to the thickness e of the metal conductors of the electronic modules. The hollow 52 is generally rectangular in shape and its size is slightly greater than the outside dimensions of the lead frame A of the electronic module, thereby enabling the module to be fully received therein. The body of the card also includes a second hollow 54 constituted by a central cylindrically shaped cavity 56 surrounded by eight subsidiary cavities 58. The central cavity 56 opens out into the bottom 59 of the first hollow 52 and into the bottom 50b of the card body. The subsidiary cavities 58 also open out into the bottom 59 of the first hollow 52 and they communicate with the central cavity 56. The subsidiary hollows 58 have a depth of 0.1 mm below the bottom 59 of the first hollow. As can be seen by comparing FIGS. 1 and 3, the subsidiary hollows 58 extend beneath a portion of each of the conductive zones 16 to 30 of the lead frame A.

The body 50 of the card also has fixing studs 60 which project above the bottom 59 of the first hollow 52. Each stud 60 is surrounded by an annular groove 62 provided in the bottom 59 of the first hollow 52.

By way of example, a fixing stud 60 may be 0.6 mm in diameter, i.e. its diameter is slightly less than the diameter of the fixing holes 34 provided in the electronic module. The groove 62 is of sufficient depth to receive the flared portion 56 of the conductive zones of the electronic module. There are as many fixing studs 60 as there are fixing holes 34 in the lead frame A.

The electronic module made as described above with reference to FIGS. 1 and 2 is separated from the remainder of the metal strip 10 along the pre-cutout slots 12. The conductive zones 16 to 30 remain held together by virtue of the interconnecting bridges 32. The electronic module is placed on the card body 50 in a manner such that the studs 60 penetrate into the fixing holes 34 and the bottom face 10a of the plane conductors of the electronic module lie on the bottom 59 of the first hollow 52. In this manner, the set of conductors is received in the first hollow 52 and the chip of semiconductor material 38 is received in the central cavity 56. In addition, the top face 10b of the electronic module is level with the top face 50a of the card body.

After the electronic module has been put into place, it is fixed to the body 50 of the card in temporary manner. This is shown in FIG. 4b. To do this the heads of the studs 60 are crushed, for example by means of an ultrasonic tool. By virtue of the flared shape of the zone 76 surrounding each of the fixing holes 34, the crushed heads 66 of the fixing studs are fully received in the frustoconical zone defined thereby. In other words, the top of each stud head 66 is level with the top face 10b of the electronic module.

Then, as shown in FIG. 4c, the electronic module is finally glued to the body 50 of the card. To do this, the card is turned over together with its electronic module, and the central cavity 56 is filled with an electrically insulating glue 70. The glue also penetrates by capillarity into the subsidiary cavities 58 which are closed by the presence of the electronic module. In contrast, the slots such as 14 through the metal sheet are sufficiently narrow to ensure that the surface tension of the glue prevents it from projecting beyond the top face 10b of the metal conductors. The glue is then caused to polymerize and the face 72 of the deposit of glue 70 is machined.

Figure 5:
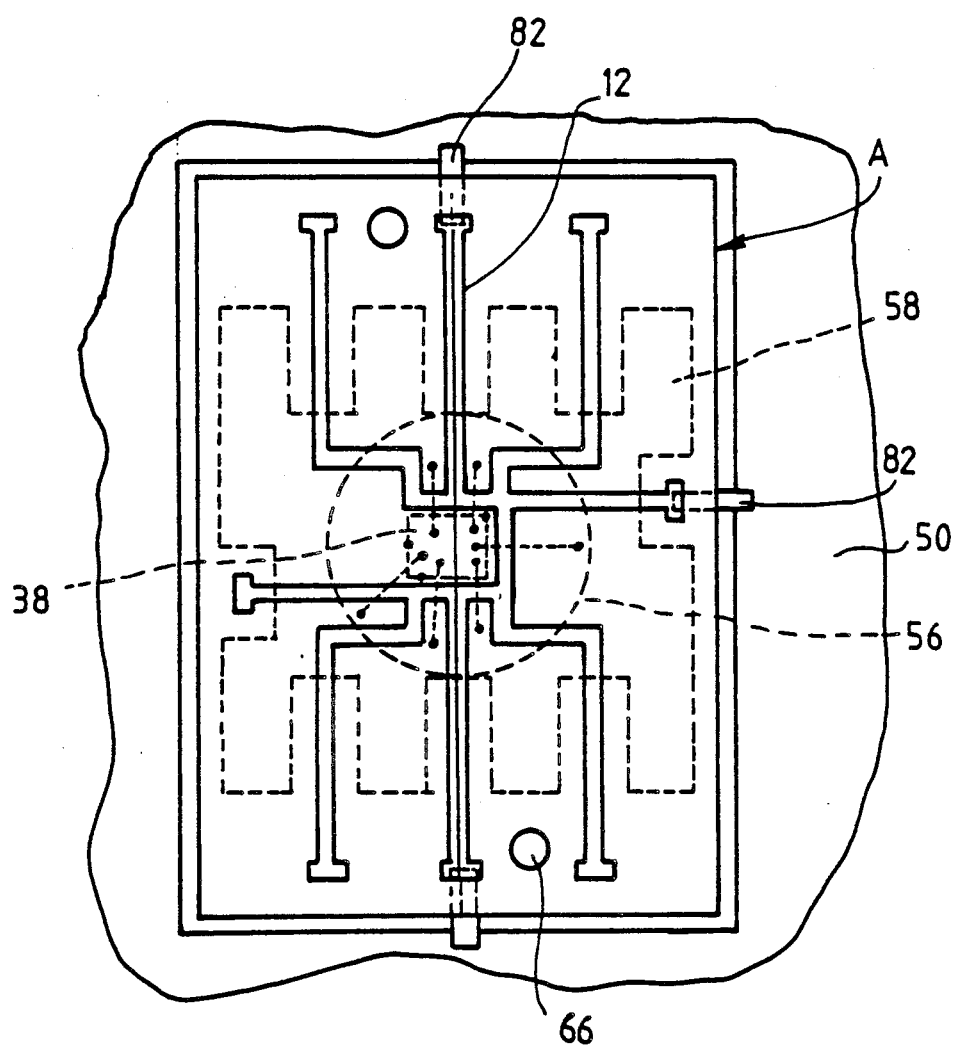
FIG. 5 is a fragmentary plan view of the electronic module and the body of the card at the end of the stage shown in FIG. 4c.

FIG. 5 is a top view of the portion of the card in which the electronic module has been mounted. This figure shows in particular how the conductive zones 16 to 30 are disposed level With the top face of the card body. Each conductive zone constitutes one of the electronic contact tabs of the card. The zone 26 to which the semiconductor chip 38 is directly fixed constitutes the ground contact. In order to terminate card manufacture, the interconnecting bridges such as 32 must be removed. This can be done by means of a cutting tool referenced 80 in FIG. 4d. This operation is made possible by virtue of the fact that the body 50 of the card is provided with holes such as 82. Each hole 82 is disposed beneath one of the interconnecting bridges 32. FIGS. 3 and 5 show only three of the holes 82.

FIGS. 6a to 6d show a second implementation of the electronic module.

In this implementation, the portion of the strip 10 for making the lead frame A has pre-cutout slots 12 and fixing holes 34 which are identical to those shown in FIG. 1. The difference lies in the fact that the slots 14 separating the conductive zones 16 extend right up to the pre-cutout slots 12. This means that the interconnecting bridges 32 of FIG. 1 no longer exist. FIG. 6a is thus identical to FIG. 2a.

In the next stage shown in FIG. 6b, the zones of the metal strip 10 surrounding the fixing holes 34 are stamped in order to form the flared zones 36 as already described with reference to FIG. 2a. During this same stage, the central zone 90 of the lead frame A is simultaneously pushed downwardly, i.e. the portion of the lead frame which comprises the zone 40 onto which the semiconductor chip is to be fixed is depressed together with the ends of the other conductive zones 16 to 24 and 28 and 30. The top face 90a of the zone 90 is thus offset relative to the top face 10b of the remainder of the lead frame and forms a depression 92.

FIG. 6c shows that the semiconductor chip 38 is then fixed on the conductive portion 40 and the terminals of the chip 38 are connected to the appropriate conductive zones by means of conductor wires 44. Thereafter the chip 38, the wires 44 and the depressed portion 90 of the conductive frame are coated in a thermo-setting material. The coating is referenced 4 in FIGS. 6c and 6d. In order to ensure that the outside of the coating 94 is properly shaped, the coating is performed by injection in a mold built up from two half-shells. The material fills the depression 92 and portions of the separator slots 14, and it surrounds the chip 38 and the wires 44. The top face 94a of the coating is level with the top face 10b of non-depressed portion of the lead frame.

The electronic module obtained in this way is separated from the remainder of the metal strip 10 and is then put into place and fixed in the body of the card 50 in exactly the same way as the electronic module described with reference to FIGS. 4a to 4d. To make this possible, the outside dimensions of the portion of the coating 94 surrounding the chip 38 must be smaller than the dimensions of the central cavity 56 of the card body 50.

The heads of the fixing studs 60 are then crushed and the electronic module is then finally glued to the body of the card. The advantage of this implementation lies in the stage of FIG. 4d being omitted since the lead frame no longer includes any interconnecting bridges.

FIGS. 7a to 7c show a third implementation of the invention, and more precisely a third implementation of the electronic module.

The initial lead frame is identical to that shown in FIGS. 1 and 2a except that the central zone 40 on which the semiconductor chip 38 is fixed is provided with a cavity 100 which opens out into the bottom face 10a of the lead frame A. The cavity 100 is big enough to partially receive the chip 38. The cavity 100 may be obtained by chemically etching the conductive strip 10 while making the slot 12 and 14 and the fixing holes 34. For example, both faces of the strip may be chemically etched in order to obtain the slots 12 and 14 and the holes 34 while only the face 10a is etched in order to make the cavity 100. Thereafter the electronic module is cut out from the remainder of the metal strip 10 and is fixed to the body of the card exactly as described with reference to FIGS. 4a to 4d.

This third implementation of the invention serves to reduce the thickness of the electronic module. In addition, it may be combined with the second implementation i.e. prior to depressing the central zone 90 of the lead frame (6d), a cavity is made in the central portion 40 thereof identical to that shown in FIG. 7a.

In the implementations described above, the electronic module is positioned and temporarily fixed to the body of the card by co-operation between fixing studs constituting an integral portion of the card body and fixing holes provided in the electronic module.

Figure 8A:
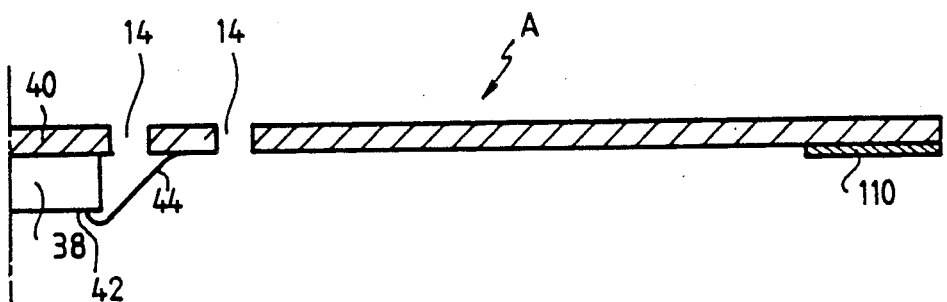
FIGS. 8a to 8c are half views in vertical section showing a fourth implementation of the invention.
Figure 8B:
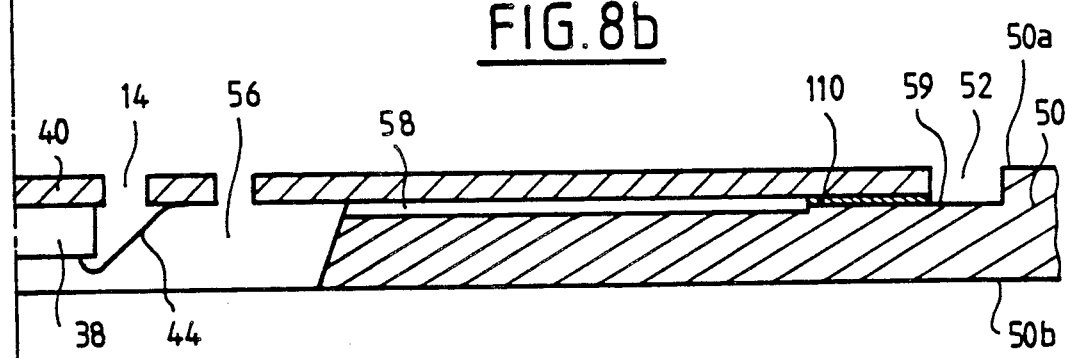
Figure 8C:
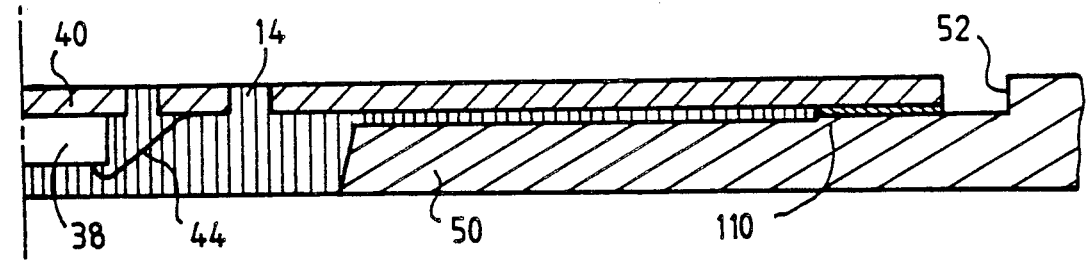

There now follows a description, with reference to FIGS. 8a to 8c of a fourth implementation of the card which makes use of a different technique for obtaining the initial temporary fixing of the electronic module.

FIG. 8a shows an electronic module which is very similar to the module shown in FIG. 2c. It comprises the lead frame A together with its slots 14 separating the various conductive zones, the semiconductor chip 38 fixed to the central conductive portion 40, and the conductor wires 44 connecting the terminals 42 of the chip 38 to appropriate conductive zones of the lead frame. Relative to FIG. 2c, the electronic module no longer has fixing holes 34. In contrast, the bottom face of the periphery of the lead frame is covered with a thin film 110 of adhesive material.

As shown in FIG. 8b, the housing provided in the body 50 of the card is also slightly different from that shown in the preceding figures.

It comprises an upper hollow 52 for receiving the lead frame and a lower hollow 54 including a central cavity 56 for receiving the semiconductor chip 38 and subsidiary cavities 58. In contrast, the body of the card no longer has any fixing studs 60 or annular grooves 62 as shown in FIG. 4a.

The electronic module is placed on the body of the card in such a manner that the lead frame is received in the upper hollow 52 and the chip 38 is received in the central cavity 56, with the thin layer 110 of adhesive material coming into contact with the bottom 59 of the upper hollow 52. After the layer of glue has polymerized, the electronic module is positioned and temporarily fixed to the body of the card.

FIG. 8c shows the electronic module is finally fixed to the body of the card. This stage is identical to that already described with reference to FIG. 4c. Finally, the interconnecting bridges are cut as already explained with reference to FIG. 4d.

In the above description, it has always been assumed that the central cavity 56 receiving the semiconductor chip opens out into the bottom 50b of the card body. The invention is also applicable to a cavity 56 which does not go right through the card. In this case, a drop of polymerizable insulating glue is placed in the bottom of the blind cavity. Then the electronic module is put into place on the body of the card and is temporarily fixed using one of the techniques described above. There after the assembly constituted by the card and the electronic module is turned upside-down so that the drop of glue completely covers the semiconductor chip and its conductor wires and so that the glue penetrates into the subsidiary cavities 58. Finally the glue is caused to polymerize thereby providing final bonding between the card body and the electronic module.

I claim:
1. The method of manufacturing an electronic memory card, comprising the steps of:
    (a) providing a solid sheet element of electrically conductive material having a substantially planar set of electrical conductors which will be used to define electrical connections and external contact tabs for said memory card, said substantially planar set of electrical conductors having a first face and a second face;
    (b) forming slots through said sheet element in order to define and separate conductive zones forming said electrical connections and said external contact tabs from one another, while leaving material which forms interconnecting bridges at the periphery of said sheet element between said conductive zones in order to hold said conductive zones together;
    (c) fixing a semiconductor chip directly to said first face of said substantially planar set of electrical conductors in order to form an electronic module;
    (d) providing a card body having a first main face and a second main face, said main faces being substantially mutually parallel, said card body having a housing which opens out at least into said first main face, said housing having a size and shape which is suitable for receiving said electronic module;
    (e) placing said electronic module into said housing so that said second face of said substantially planar set of electrical conductors lies substantially in the same plane as said first main face of said card body;
    (f) fixing said electronic module to said card body; and
    (g) cutting said interconnecting bridges in order to electrically isolate said conductive zones from one another.

2. The method of claim 1 further comprising the steps of:
    (a) forming fixing holes in said substantially planar set of electrical conductors;
    (b) forming said card body of plastic material;
    (c) forming fixing studs on said card body;
    (d) placing said electronic module into said housing in such manner that said studs penetrate through said fixing holes; and
    (e) wherein said step of fixing said electronic module to said card body is comprised of the steps of:
        (1) deforming the heads of said studs to provide preliminary fixing of said module to said card body; and (2) gluing said module to said card body using an electrically insulating adhesive substance in such a manner that said adhesive substance fills substantially all of the portion of said housing which is not occupied by said electronic module.

3. The method of claim 2, wherein said housing provided in said card body comprises a first hollow opening which extends out to said first main face of said card body whereby said housing is adapted to receive said substantially planar set of conductors, and a second hollow including a main cavity which opens out to the bottom of said first hollow and to said second main face of the card body, and subsidiary cavities opening out to the bottom of said first hollow and into said main cavity, said main cavity being shaped to receive said semiconductor chip, and wherein, during said step of placing said electronic module in said housing, said electronic module is placed in said first hollow so that said first face of said substantially planar set of conductors is substantially in contact with the bottom of said first hollow, and wherein during said step in which said electronic module is glued to said card body, said insulating adhesive substance is inserted via said main cavity to fill substantially all of the portion of said second hollow which is not occupied by said electronic module.

4. The method of claim 2 wherein the portions of said electrical conductors of said substantially planar set are flared and project into said first face of the planar set where they surround said fixing holes so that during said step of deforming the heads of said studs to provide preliminary fixing of said module to said card body the deformed heads of said fixing studs are substantially entirely received in the hollowed zones thereby provided.

5. The method of claim 1, wherein said housing provided in said card body comprises a first hollow opening which extends out to said first main face of said card body to receive said substantially planar set of conductors, and a second hollow which comprises a main cavity which extends out to the bottom of said first hollow and into said second main face of said card body, together with subsidiary cavities opening out to the bottom of said first hollow and to said main cavity, said main cavity being suitable for receiving said semi-conductor chip; and wherein said step of fixing said electronic module to said card body is subdivided into steps of:
(a) gluing the periphery of said substantially planar set of electrical conductors to the bottom of said first hollow; and
(b) inserting said insulating adhesive substance via said main cavity to fill substantially all of that portion of said second hollow which is not occupied by said electronic module.

6. The method of manufacturing an electronic memory card, comprising the steps of:
(a) defining a plurality of disjoint surfaces in a conductive metal sheet with said surface being suitable for forming substantially planar set of electrical conductors for defining electrical connections and external contact tabs for said memory card, said substantially planar set having a first face and a second face;
(b) forming a plurality of separation slots in each surface in order to mutually separate conductive zones forming said electrical connections and said contact tabs, each conductive zone remaining fixed to the portion of said conductive metal sheet which lies outside its respective surface from among said plurality of disjoint surfaces;
(c) fixing a semiconductor chip directly to said first face;
(d) electrically connecting the terminals of said chip to said electrical conductors with electrical connection means;
(e) coating said semiconductor chip, said electrical connection means and a part of said substantially planar set adjacent to said semiconductor chip with an insulating adhesive material, whereby an electronic module is obtained;
(f) separating said electronic module obtained in this way from the remainder of said sheet;
(g) providing a card body having first and second main faces which are substantially mutually parallel, said card body having a housing which opens out at least into said first main face and which is suitable for receiving said electronic module;
(h) placing said electronic module in said housing so that said second face of the substantially planar set of electrical conductors lies substantially in the same plane as said first main face of the card body; and
(i) fixing said electronic module to said card body.

7. The method of claim 6, further comprising the steps of:
(a) forming fixing holes in said substantially planar set of conductors;
(b) forming said card body of plastic;
(c) forming fixing studs on said card body, wherein said electronic module is placed in said housing so that said second face of the substantially planar set of electrical conductors lies substantially in the same plane as said first main face of said card body so that said fixing studs penetrate through said fixing holes and wherein said step of fixing said electronic module to said card body is subdivided into the steps of:
(1) deforming the heads of said fixing studs to provide preliminary fixing of said module to said card body; and
(2) gluing said module to said card body using an electrically insulating adhesive substance in such a manner that said adhesive substance fills substantially all of the portion of said housing which is not occupied by said electronic module.

8. The method of claim 7, wherein said housing provided in said card body comprises a first hollow which opens out to said first main face of the card body and which is sized and shaped to receive said substantially planar set of conductors and a second hollow, including a main cavity which opens out to the bottom of said first hollow and into said second main face of said card body, and subsidiary cavities which open out to the bottom of said first hollow and to said central cavity, said central cavity being sized and shaped to receive said semiconductor chip wherein during said step of placing said electronic module in said housing, said electronic module is placed in said first hollow so that said first face of said substantially planar set of conductors is substantially in contact with the bottom of said first hollow, and wherein during said step in which said electronic module is glued to said card body, said insulating adhesive substance is inserted via said central cavity to fill substantially all of the portion of said second hollow which is not occupied by said electronic module.

9. The method of claim 7 wherein the portions of said electrical conductors of said substantially planar set are flared and project into said first face of the planar set where they surround said fixing holes thereby providing hollowed zones so that during said step of deforming the heads of said studs to provide preliminary fixing of said module to said card body the deformed heads of said fixing studs are substantially entirely received in the hollowed zones.

10. The method of claim 6 wherein said housing provided in said card body comprises a first hollow opening which extends out to said first main face of said card body to receive said substantially planar set of conductors, and a second hollow which comprises a main cavity which extends out to the bottom of said first hollow and into said second main face of said card body, together with subsidiary cavities opening out to the bottom of said first hollow and to said main cavity, said main cavity being suitable for receiving said semi-conductor chip; and wherein said step of fixing said electronic module to said card body is subdivided into steps of:

(a) gluing the periphery of said substantially planar set of electrical conductors to the bottom of said first hollow; and
  (b) inserting said insulating adhesive substance via said main cavity to fill substantially all of that portion of said second hollow which is not occupied by said electronic module.

11. An electronic module for an electronic memory card comprising a substantially planar set of electrical conductors for defining electrical connections and external contact tabs for said card, said substantially planar set having a first face and a second face, and being comprised of a sheet element of a conductive material having slots made therethrough for mutually separating conductive zones forming said electrical connections and said contacts tabs, one of said conductive zones including an end disposes substantially in the center of said sheet element, a semiconductor chip having terminals directly fixed to said first face and more particularly to said end of said conductive zone by electrically conductive fixing means, and means for electrically connecting said terminals of said chip to said electrical conductors, said semiconductor chip and said electrical connection means being coated in an insulating adhesive material, wherein a central portion of said sheet element including said end of the conductive zone on which said semiconductor chip is fixed is offset from said second face of said sheet element in order to form a depression, and said insulating adhesive material also fills said depression and those portions of said separation slots which are disposed in said central portion.

12. An electronic memory card comprising:
  (a) a substantially planar set of electrical conductors for defining electrical connections and external contact tabs for said card, said substantially planar set having a first face and a second face, and being constituted by a sheet element of a conductive material having slots made therethrough for mutually separating conductive zones forming said electrical connections and said contacts tabs, one of said conductive zones including an end disposed substantially in the center of said sheet element, a semiconductor chip having terminals directly fixed to said first face and more particularly to said end of said conductive zone by electrically conductive fixing means, and means for forming an electronic module by electrically connecting said terminals of said chip to said electrical conductors, and coating said semiconductor chip and said electrical connection means in an insulating adhesive material; and
  (b) a card body having first and second main faces which are substantially parallel to each other, and provided with a housing opening out into at least said first main face and suitable for receiving said electronic module, and means for fixing said electronic module in said housing of said card body so that said second face of the substantially planar set of electrical conductors is disposed substantially in the same plane as said first main face of the card body.

* * * * *